(12) United States Patent  
Hsu et al.

(10) Patent No.: US 11,770,985 B2
(45) Date of Patent: Sep. 26, 2023

(54) RESISTIVE RANDOM ACCESS MEMORY AND METHOD OF FABRICATING THE SAME

(71) Applicant: Winbond Electronics Corp., Taichung (TW)

(72) Inventors: Po-Yen Hsu, Taichung (TW); Bo-Lun Wu, Taichung (TW); Shih-Ning Tsai, Taichung (TW)

(73) Assignee: Winbond Electronics Corp., Taichung (TW)

( * ) Notice: Subject to any disclaimer, the term of this patent is extended or adjusted under 35 U.S.C. 154(b) by 254 days.

(21) Appl. No.: 17/027,700

(22) Filed: Sep. 21, 2020

(65) Prior Publication Data

US 2022/0093858 A1    Mar. 24, 2022

(51) Int. Cl.
*H10N 70/00* (2023.01)
*H10B 63/00* (2023.01)
*H10N 70/20* (2023.01)

(52) U.S. Cl.
CPC .......... *H10N 70/841* (2023.02); *H10B 63/00* (2023.02); *H10N 70/063* (2023.02); *H10N 70/24* (2023.02); *H10N 70/8833* (2023.02)

(58) Field of Classification Search
CPC ... H01L 45/146; H01L 45/08; G11C 2213/56; G11C 2213/51
See application file for complete search history.

(56) References Cited

U.S. PATENT DOCUMENTS

| 10,522,755 | B2 | 12/2019 | Hsu et al. |
| 2016/0064664 | A1* | 3/2016 | Dang ................. H10N 70/8833 257/4 |
| 2017/0117463 | A1* | 4/2017 | Chen ................... H10N 70/828 |
| 2020/0083446 | A1 | 3/2020 | Hsu et al. |

FOREIGN PATENT DOCUMENTS

| CN | 106654004 | 5/2017 |
| EP | 3163642 | 5/2017 |
| JP | 6270926 | 1/2018 |
| KR | 101869516 | 6/2018 |
| TW | I553926 | 10/2016 |

* cited by examiner

*Primary Examiner* — Amar Movva
(74) *Attorney, Agent, or Firm* — JCIPRNET

(57) ABSTRACT

Provided is a resistive random access memory (RRAM) including a first electrode layer and a second electrode layer disposed opposite to each other, a variable resistance layer located between the first electrode layer and the second electrode layer, an oxygen exchange layer located between the variable resistance layer and the second electrode layer, a conductive layer laterally surrounding a sidewall of the oxygen exchange layer, a first barrier layer located between the conductive layer and the oxygen exchange layer and between the oxygen exchange layer and the variable resistance layer, and a second barrier layer located between the conductive layer and the second electrode layer and between the second electrode layer and the oxygen exchange layer.

16 Claims, 3 Drawing Sheets

RESISTIVE RANDOM ACCESS MEMORY AND METHOD OF FABRICATING THE SAME

BACKGROUND

1. Technical Field

The disclosure relates to a memory and a method of fabricating the same, and in particular, to a resistive random access memory (RRAM) and a method of fabricating the same.

2. Description of Related Art

A resistive random access memory (RRAM) features the advantages of high operation speed, low power consumption and the like, so it has become a non-volatile memory that has been widely studied in recent years. However, an etchant used in the fabricating process of the RRAM, in the deposition process of a dielectric layer, or in the detection process may easily lead to oxidation of sidewalls of oxygen exchange layers. As such, effective areas of multiple oxygen exchange layers of the RRAM are different from each other, resulting in uneven oxygen distribution and resulting in uneven forming current distribution of the RRAM, and reliability of the RRAM is thereby affected.

SUMMARY

The disclosure provides a resistive random access memory (RRAM) and a method of fabricating the same, which may prevent sidewalls of oxygen exchange layers from being oxidized.

The disclosure provides a RRAM and a method of fabricating the same, which may control oxygen exchange layers to have substantially same effective areas to evenly distribute oxygen, so that the RRAM may have even forming current distribution.

An embodiment of the disclosure further provides an RRAM which includes a first electrode layer and a second electrode layer disposed opposite to each other, a variable resistance layer located between the first electrode layer and the second electrode layer, an oxygen exchange layer located between the variable resistance layer and the second electrode layer, a conductive layer laterally surrounding a sidewall of the oxygen exchange layer, a first barrier layer located between the conductive layer and the oxygen exchange layer and between the oxygen exchange layer and the variable resistance layer, and a second barrier layer located between the conductive layer and the second electrode layer and between the second electrode layer and the oxygen exchange layer.

An embodiment of the disclosure further provides a method of fabricating an RRAM, and the method includes the following steps. A variable resistance layer is formed on a first electrode layer. A conductive layer is formed on the variable resistance layer. An opening is formed in the conductive layer. A first barrier layer and an oxygen exchange layer are formed in the opening. A second barrier layer is formed on the conductive layer and the oxygen exchange layer. A second electrode layer is formed on the second barrier layer.

Based on the above, the RRAM and the method of fabricating the same provided by the disclosure may prevent the sidewall of the oxygen exchange layer from being oxidized and may control the oxygen exchange layer to have substantially the same effective areas to evenly distribute oxygen, so that the RRAM may have even forming current distribution. In addition, during a SET operation, in addition to forming currents generated by forming of filaments, FN tunneling may also be induced between the conductive layers surrounding the variable resistance layer and the oxygen exchange layer, and the caused leakage currents may increase total currents.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
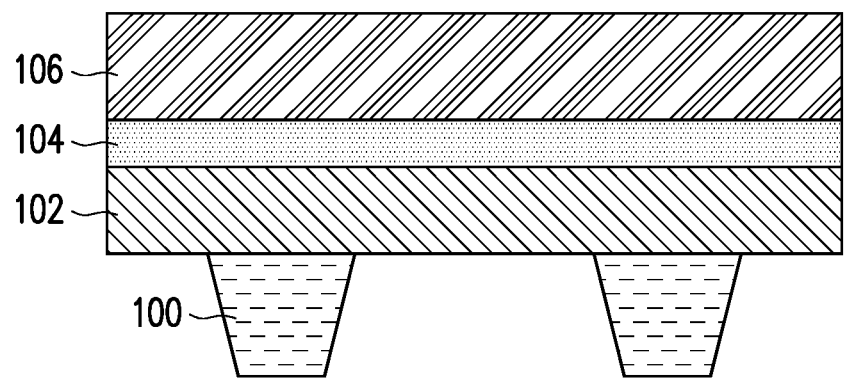
FIGS. 1A to 1F are schematic cross-sectional views of a process of fabricating a resistive random access memory (RRAM) according to the embodiments of the disclosure.
Figure 1B:
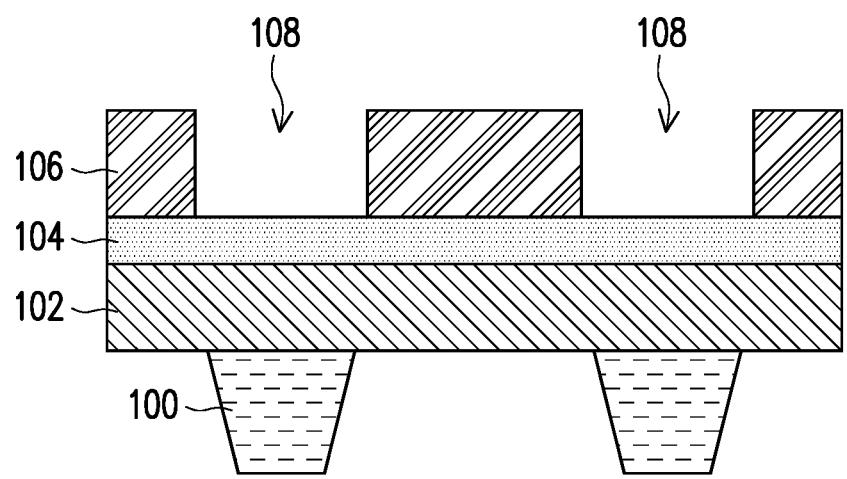
Figure 1C:
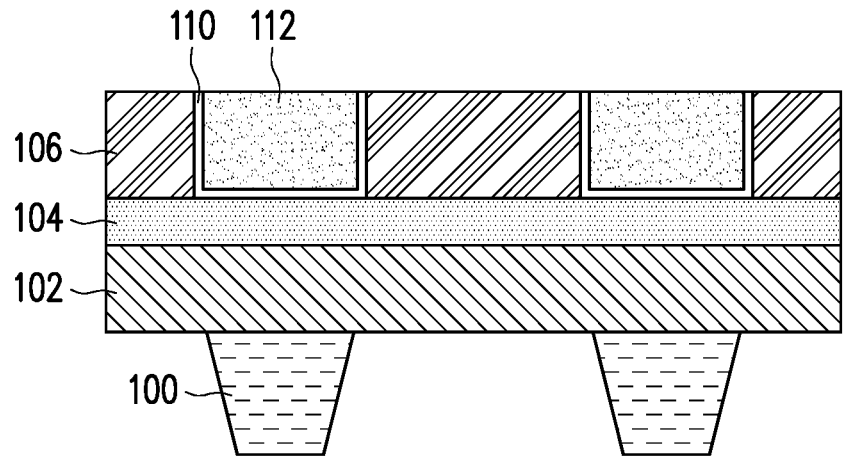
Figure 1D:
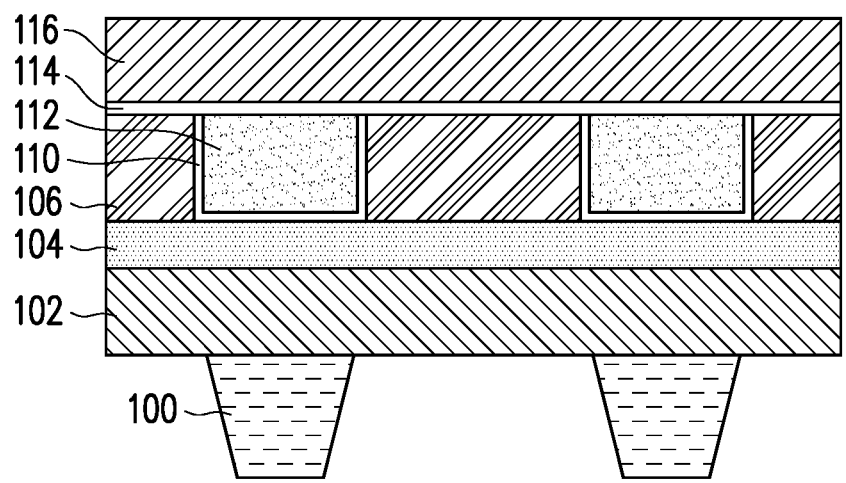
Figure 1E:
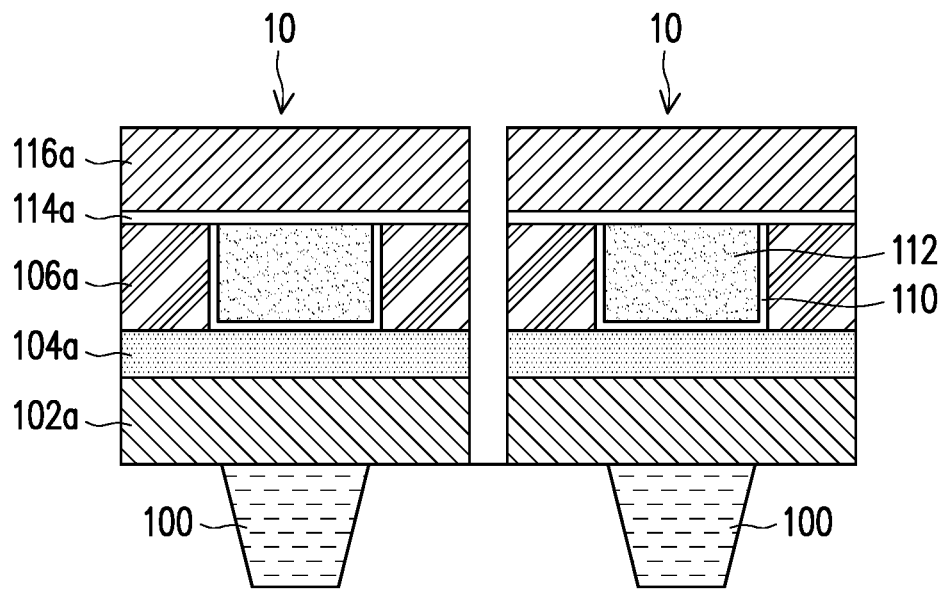
Figure 1F:
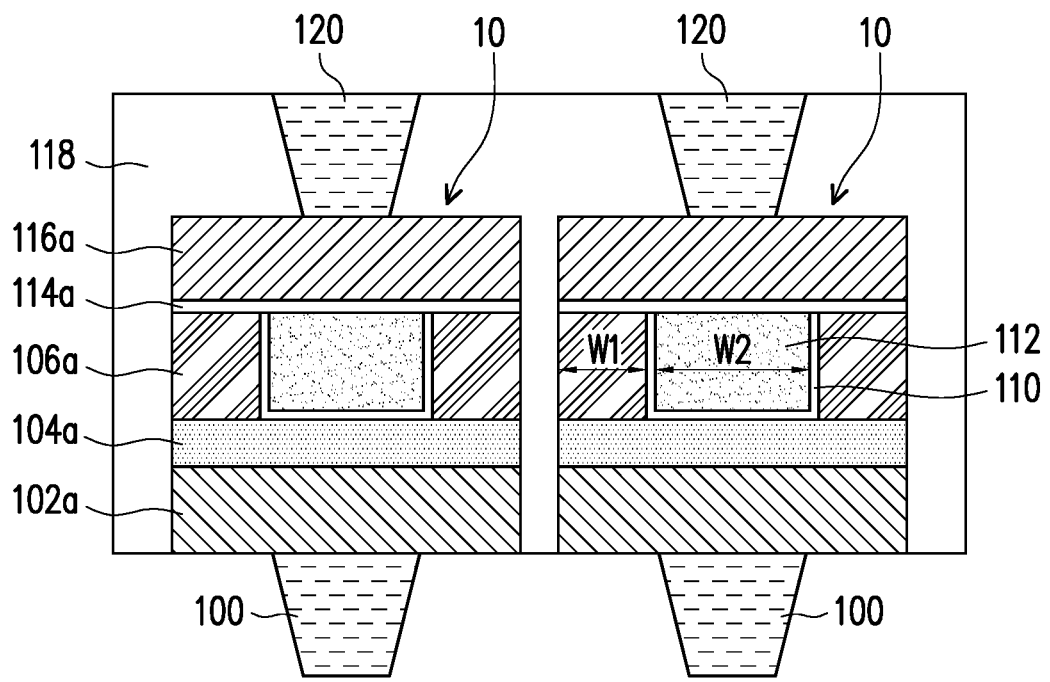

Referring to FIG. 1F, a resistive random access memory (RRAM) unit 10 includes a first electrode layer 102a, a variable resistance layer 104a, a conductive layer 106a, an oxygen exchange layer 112, a first barrier layer 110, a second barrier layer 114a, and a second electrode layer 116a.

The first electrode layer 102a may be connected to a via 100. The via 100 is, for example, any via of a metal interconnection structure formed on a substrate, such as a via of a same height as a first layer of via that is in contact with a first metal layer closest to the substrate. The substrate may be a semiconductor substrate or a semiconductor-on-insulator (SOI) substrate. Other assemblies may be included between the substrate and the first metal layer, such as transistors. The second electrode layer 116a may be connected to a via 120. The via 120 is, for example, any via of a metal interconnection structure, such as a via of a same height as a second layer of via that is in contact with a second metal layer. The via 100 and the via 120 are, for example, tungsten, aluminum, cuprum, or a combination thereof formed by physical vapor deposition.

Materials of the first electrode layer 102a and the second electrode layer 116a may include metals, metal nitrides, other materials or a combination thereof. Materials of the first electrode layer 102a and the second electrode layer 116a are, for example, titanium nitride (TiN), tantalum nitride (TaN), titanium aluminum nitride (TiAlN), titanium tungsten (TiW) alloys, platinum (Pt), iridium (Ir), ruthenium (Ru), titanium (Ti), tungsten (W), tantalum (Ta), aluminum (Al), zirconium (Zr), hafnium (HO, nickel (Ni), cuprum (Cu), cobalt (Co), ferrum (Fe), gadolinium (Gd), manganese (Mo), graphite, or a combination thereof. A forming method of the first electrode layer 102a and the second electrode layer 116a may be, for example, physical vapor deposition or chemical vapor deposition. The first electrode layer 102a and the second electrode layer 116a may be a single layer or multiple layers. Thicknesses of the first electrode layer 102a and the second electrode layer 116a are not particularly limited, but are generally in a range of 5 nanometers (nm) to 500 nm.

The variable resistance layer 104a is located between the first electrode layer 102a and the second electrode layer 116a. The variable resistance layer 104a may have the following characteristics: when a positive bias voltage is applied to the RRAM, oxygen ions are attracted by the positive bias voltage to leave the variable resistance layer 104a, so as to generate oxygen vacancy, form filaments and present a conduction state, and at this time, the variable resistance layer 104a transforms from a high resistance state (HRS) to a low resistance state (LRS); and when a negative bias voltage is applied to the RRAM, the oxygen ions may enter the variable resistance layer 104a, so as to break the filaments and present a non-conduction state, and at this time, the variable resistance layer 104a transforms from the LRS to the HRS. Generally speaking, the transformation of the variable resistance layer 104a from the HRS to the LRS is referred to as a set (hereinafter referred to as SET) operation, and the transformation of the variable resistance layer 104a from the LRS to the HRS is referred to as a reset (hereinafter referred to as RESET) operation. A material of the variable resistance layer 104a is not particularly limited, and any material that may change its own resistance by application of the voltage may be used. In this embodiment, the material of the variable resistance layer 104a includes a metal oxide, such as hafnium oxide ($HfO_2$), tantalum oxide ($Ta_2O_5$), titanium oxide ($TiO_2$), magnesium oxide (MgO), nickel oxide (NiO), niobium oxide ($Nb_2O_5$), aluminum oxide ($Al_2O_3$), vanadium oxide ($V_2O_5$), tungsten oxide ($WO_3$), zinc oxide (ZnO), or cobalt oxide (CoO). A forming method of the variable resistance layer 104a is, for example, chemical vapor deposition or atomic layer deposition. In this embodiment, an oxygen content of the variable resistance layer 104a may be approximately 75 atomic percentage (at %) to approximately 100 at %. A thickness of the variable resistance layer 104a is, for example, 2 nm to 10 nm.

The conductive layer 106a, the first barrier layer 110, the oxygen exchange layer 112 and the second barrier layer 114a are located between the variable resistance layer 104a and the second electrode layer 116a. The oxygen exchange layer 112 is surrounded and coated with the first barrier layer 110 and the second barrier layer 114a. The first barrier layer 110 is located between the conductive layer 106a and the oxygen exchange layer 112 and between the oxygen exchange layer 112 and the variable resistance layer 104a. The second barrier layer 114a is located between the second electrode layer 116a and the conductive layer 106a and between the second electrode layer 116a and the oxygen exchange layer 112. The first barrier layer 110 and the second barrier layer 114a may include a dielectric material layer with high dielectric constant, such as aluminum oxide ($Al_2O_3$), hafnium oxide ($HfO_2$) or zirconium oxide ($ZrO_2$). In the present embodiment, when the RRAM unit 10 performs the RESET operation, the first barrier layer 110 and the second barrier layer 114a may block the diffusion of oxygen ions in the oxygen exchange layer 112 to the second electrode layer 116a.

The oxygen exchange layer 112 is surrounded and coated with the first barrier layer 110 and the second barrier layer 114a. A sidewall and a bottom surface of the oxygen exchange layer 112 are covered with the first barrier layer 110, and a top surface of the oxygen exchange layer 112 is covered with the second barrier layer 114a. The oxygen exchange layer 112 may be made of a material that is more easily bonded with oxygen than the conductive layer 106a and the variable resistance layer 104a. When the RRAM unit 10 performs the SET operation, the oxygen ions in the variable resistance layer 104a may enter the oxygen exchange layer 112 after leaving the variable resistance layer 104a through being attracted by the positive bias voltage; and when the RRAM unit 10 performs the RESET operation, the oxygen ions in the oxygen exchange layer 112 may return to the variable resistance layer 104a. A material of the oxygen exchange layer 112 may include a metal oxide which is incompletely oxidized. In other words, the oxygen exchange layer 112 itself is a metal layer containing oxygen ions. When the RRAM unit 10 performs the RESET operation, there are enough oxygen ions in the oxygen exchange layer 112 may enter a variable resistance layer 104, because there are oxygen ions from the variable resistance layer 104a and oxygen ions contained by the oxygen exchange layer 112 in the oxygen exchange layer 112. Specifically, in the present embodiment, a material of the oxygen exchange layer 112 may include, for example, $TiO_{2-x}$, $HrO_{2-x}$ or $TaO_{2-x}$, where x is 0.2 to 0.7. In the present embodiment, a top area of the oxygen exchange layer 112 is less than a bottom area of the second electrode layer 116a, and a bottom area of the oxygen exchange layer 112 is less than a top area of the variable resistance layer 104a.

The conductive layer 106a is located between the second barrier layer 114a and the variable resistance layer 104a, and laterally surrounds sidewalls of the oxygen exchange layer 112 and the first barrier layer 110, so as to prevent the oxygen from being diffused into the oxygen exchange layer 112. In one embodiment, a top surface of the conductive layer 106a is coplanar with a top surface of the first barrier layer 110 and the top surface of the oxygen exchange layer 112. A bottom surface of the conductive layer 106a is coplanar with the top surface of the first barrier layer 110. The conductive layer 106a includes a material that is less easily bonded with the oxygen than the oxygen exchange layer 112. The conductive layer 106a may also be referred to as an inert conductive layer 106a. The conductive layer 106a may be a single layer or multiple layers. A material of the conductive layer 106a may be a metal or a metal nitride, such as platinum, iridium, ruthenium, rhodium, tungsten, titanium, hafnium, tantalum, hafnium nitride, tantalum nitride, titanium nitride, tungsten nitride, or a combination thereof. A forming method of the conductive layer 106a is, for example, physical vapor deposition. A thickness of the conductive layer 106a is, for example, 10 nm to 100 nm. Viewed from the top view, each conductive layer 106a may be a ring surrounding the oxygen exchange layer 112. A width W1 of the ring of the conductive layer 106a is less than a width W2 of the oxygen exchange layer 112. A ratio of the width W1 of the ring of the conductive layer 106a to the width W2 of the oxygen exchange layer 112 is, for example, 0.2 to 0.8. The width W1 of the ring of the conductive layer 106a is, for example, 50 nm to 200 nm.

When the RRAM performs the SET operation, the oxygen ions in the variable resistance layer 104a may enter the oxygen exchange layer 112 after leaving the variable resistance layer 104a through being attracted by the positive bias voltage, so as to generate oxygen vacancy on the variable resistance layer 104a to form filament currents. In addition, during the SET operation, electrons in the variable resistance layer 104a are attracted by the positive bias voltage, and induce Fowler-Nordheim (FN) tunneling between the conductive layer 106a and the variable resistance layer 104a, and thus resulting in leakage currents. The formation of the leakage currents may increase the total currents of the SET operation. When the RRAM unit 10 performs the RESET operation, the oxygen ions in the oxygen exchange layer 112 may return to the variable resistance layer 104a, and FN tunneling may not be induced between the variable resistance layer 104a and the conductive layer 106a.

A sidewall and a top surface of the RRAM unit 10 are surrounded and covered by a dielectric layer 118. Sidewalls of the first electrode 102a, the variable resistance layer 104a, the conductive layer 106a and the first barrier layer 110 and a sidewall and a top surface of the second electrode layer 116a of the RRAM unit 10 are covered with and in contact with the dielectric layer 118. The oxygen exchange layer 112 and the dielectric layer 118 are separated by the first barrier layer 110 and the conductive layer 106a without contact.

A method of fabricating the RRAM unit 10 may be explained as follows with reference to FIGS. 1A to 1F. In the text, the same or similar components use the same or similar assembly symbols, and may be formed by using the same materials or methods. For example, components of the first electrode layer 102 and 102a may be formed by using a same material or method.

Referring to FIG. 1A, a first electrode layer 102, a variable resistance layer 104, and a conductive layer 106 are sequentially formed on a substrate (not shown) where a via 100 is formed. A material of the via 100 is, for example, tungsten.

Referring to FIG. 1B, a lithography and etching process (e.g., anisotropic etching process) is performed to pattern the conductive layer 106, so as to form an opening 108 in the conductive layer 106. The opening 108 exposes the variable resistance layer 104.

Referring to FIG. 1C, a first barrier layer 110 and an oxygen exchange layer 112 are formed in the opening 108. A forming method of the first barrier layer 110 and the oxygen exchange layer 112 includes, for example, the steps described below. The first barrier layer 110 and the oxygen exchange layer 112 are formed on the conductive layer 106 and in the opening 108, and then a chemical-mechanical grinding process is performed to remove the first barrier layer 110 and the oxygen exchange layer 112 on the conductive layer 106.

Referring to FIG. 1D, a second barrier layer 114 and a second electrode layer 116 are formed on the conductive layer 106, the first barrier layer 110, and the oxygen exchange layer 112.

Referring to FIG. 1E, the lithography and etching process is performed to pattern the second electrode layer 116, the second barrier layer 114, the conductive layer 106, the variable resistance layer 104, and the first electrode layer 102 to form a plurality of RRAM units 10. Each of the plurality of RRAM units 10 includes the first electrode layer 102a, the variable resistance layer 104a, the conductive layer 106a, the oxygen exchange layer 112, the first barrier layer 110, the second barrier layer 114a, and the second electrode layer 116a.

Referring to FIG. 1F, a dielectric layer 118 is formed on the substrate. The dielectric layer 118 is, for example, silicon oxide formed by chemical vapor deposition or a material with low dielectric constant. After that, the lithography and etching process is performed to form a via opening in the dielectric layer 118. Next, a via 120 is formed in the via opening. A material of the via 120 is, for example, tungsten.

In summary, since the oxygen exchange layer of the embodiment of the disclosure is coated with the variable resistance layer, the conductive layer, the second barrier layer, and the second electrode layer, an etchant used for etching the conductive layer may not be in contact with the oxygen exchange layer, and the dielectric layer may also not be in contact with the oxygen exchange layer. Therefore, the sidewall of the oxygen exchange layer may not be oxidized during etching, dielectric layer deposition, thermal processing, or testing, which affects its effective area and volume.

In the method provided by the embodiments of the disclosure, through the control of the patterning process, the oxygen exchange layers of the RRAM units may have substantially the same effective areas to evenly distribute oxygen. Therefore, the RRAM may have even forming current distribution.

Furthermore, since the method provided by the embodiments of the disclosure may avoid forming of oxide layers by the oxidation of the sidewall of the oxygen exchange layer, during the operation of the RRAM, these additionally formed oxide layers may be prevented from providing additional oxygen atoms or oxygen ions to cause a problem of reliability.

On the other hand, when the RRAM unit performs the SET operation, in addition to the forming currents generated by forming of the filaments, FN tunneling may also be induced between the conductive layers surrounding the variable resistance layer and the oxygen exchange layer to generate leakage currents, so that a cycling window may be added to reduce the bias voltage during the RESET operation, and the complementary switching (CS) effect is avoided.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A resistive random access memory, comprising:
   a first electrode layer and a second electrode layer, disposed opposite to each other;
   a variable resistance layer, located between the first electrode layer and the second electrode layer;
   an oxygen exchange layer, located between the variable resistance layer and the second electrode layer;
   a conductive layer, laterally surrounding a sidewall of the oxygen exchange layer;
   a first barrier layer, laterally located between the conductive layer and the oxygen exchange layer and vertically between the oxygen exchange layer and the variable resistance layer; and
   a second barrier layer, vertically located between the conductive layer and the second electrode layer and vertically located between the second electrode layer and the oxygen exchange layer,
   wherein a bottom surface of the conductive layer is in physical contact with a top surface of the variable resistance layer.

2. The resistive random access memory according to claim 1, wherein the conductive layer comprises a material that is less easily bonded with oxygen than the oxygen exchange layer.

3. The resistive random access memory according to claim 1, wherein a material of the conductive layer comprises platinum, iridium, ruthenium, rhodium, tungsten, titanium, hafnium, tantalum, hafnium nitride, tantalum nitride, titanium nitride, tungsten nitride, or a combination thereof.

4. The resistive random access memory according to claim 1, further comprising a dielectric layer covering a top surface and a sidewall of the second electrode layer and a plurality of sidewalls of the second barrier layer, the conductive layer, the variable resistance layer, and the first electrode layer, wherein the dielectric layer and the oxygen exchange layer are separated by the conductive layer.

5. The resistive random access memory according to claim 1, wherein a top surface of the conductive layer is coplanar with a top surface of the first barrier layer and a top surface of the oxygen exchange layer.

6. The resistive random access memory according to claim 1, wherein a bottom surface of the conductive layer is coplanar with a bottom surface of the first barrier layer.

7. A method of fabricating a resistive random access memory, comprising:
   forming a variable resistance layer on a first electrode layer;
   forming a conductive layer on the variable resistance layer;
   forming an opening in the conductive layer;
   forming a first barrier layer and an oxygen exchange layer in the opening;
   forming a second barrier layer on the conductive layer and the oxygen exchange layer; and
   forming a second electrode layer on the second barrier layer,
   wherein the second barrier layer is vertically located between the conductive layer and the second electrode layer and vertically located between the second electrode layer and the oxygen exchange layer,
   wherein a bottom surface of the conductive layer is in physical contact with a top surface of the variable resistance layer.

8. The method of fabricating the resistive random access memory according to claim 7, further comprising: patterning the second electrode layer, the second barrier layer, the conductive layer, the variable resistance layer, and the first electrode layer, so as to form a plurality of resistive random access memory units.

9. The method of fabricating the resistive random access memory according to claim 7, further comprising: forming a dielectric layer to cover a plurality of top surfaces and a plurality of sidewalls of a plurality of resistive random access memory units.

10. The resistive random access memory according to claim 1, wherein a bottom surface of the second barrier layer is in contact with top surfaces of the conductive layer, the first barrier layer, and the oxygen exchange layer.

11. The resistive random access memory according to claim 1, wherein a top surface of the second barrier layer is in contact with a bottom surface of the second electrode layer.

12. The resistive random access memory according to claim 1, wherein two sidewalls of the oxygen exchange layer are isolated from the conductive layer through the first barrier layer.

13. The resistive random access memory according to claim 12, wherein a top surface of the oxygen exchange layer is isolated from the second electrode layer through the second barrier layer.

14. The resistive random access memory according to claim 1, wherein two sidewalls and a bottom of the oxygen exchange layer are in contact with the first barrier layer.

15. The resistive random access memory according to claim 14, wherein a top surface of the oxygen exchange layer is in contact with the second barrier layer.

16. The resistive random access memory according to claim 14, wherein a top surface of the conductive layer is in physical contact with a bottom surface of the second barrier layer.

\* \* \* \* \*